(12) United States Patent
Onishi et al.

(10) Patent No.: US 7,557,604 B2
(45) Date of Patent: Jul. 7, 2009

(54) INPUT CIRCUIT FOR MODE SETTING

(75) Inventors: Shinsuke Onishi, Tokyo (JP); Tsuguto Maruko, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 105 days.

(21) Appl. No.: 11/119,899

(22) Filed: May 3, 2005

(65) Prior Publication Data

US 2006/0279325 A1 Dec. 14, 2006

(51) Int. Cl.
*H03K 19/177* (2006.01)
(52) U.S. Cl. .......................................... 326/38; 326/40
(58) Field of Classification Search .................. 326/38
See application file for complete search history.

(56) References Cited

U.S. PATENT DOCUMENTS

| | | | | |
|---|---|---|---|---|
| 4,349,870 A | * | 9/1982 | Shaw et al. ..................... 712/38 |
| 4,504,926 A | * | 3/1985 | Toyoda ......................... 712/39 |
| 4,698,531 A | * | 10/1987 | Jones .......................... 327/143 |
| 4,984,216 A | * | 1/1991 | Toda et al. ............. 365/230.08 |
| 5,113,093 A | * | 5/1992 | Tashiro et al. ................. 326/16 |
| 5,124,951 A | * | 6/1992 | Slemmer et al. ....... 365/230.06 |
| 5,408,435 A | * | 4/1995 | McClure et al. ............. 365/201 |
| 5,552,899 A | * | 9/1996 | Park et al. ................... 358/442 |
| 5,559,744 A | * | 9/1996 | Kuriyama et al. ........... 365/201 |
| 5,764,075 A | * | 6/1998 | Fukushima ................... 326/38 |
| 5,898,316 A | * | 4/1999 | Kato et al. .................... 326/38 |
| 6,304,114 B1 | * | 10/2001 | Hirakawa .................... 327/143 |
| 2005/0038924 A1 | * | 2/2005 | Takahashi ...................... 710/5 |
| 2005/0142836 A1 | * | 6/2005 | Haze .......................... 438/613 |

FOREIGN PATENT DOCUMENTS

JP 9-120324 5/1997

* cited by examiner

*Primary Examiner*—Rexford N Barnie
*Assistant Examiner*—Thienvu V Tran
(74) *Attorney, Agent, or Firm*—Studebaker & Brackett PC; Donald R. Studebaker

(57) ABSTRACT

An input circuit for mode setting, comprising: a chip selection terminal that is operable both in first and second operation modes; a mode setting terminal that is used to select an operation mode from between the first and second operation modes; a logic holding circuit that holds a logic status at the mode setting terminal; and a control circuit that controls the logic holding circuit in accordance with a signal supplied to the chip selection terminal. Operation modes to be selected may be serial interface mode and parallel interface mode.

14 Claims, 12 Drawing Sheets

P/SB = OPEN

P/SB = OPEN

P/SB = "H"

P/SB = "L"

INPUT CIRCUIT FOR MODE SETTING

TECHNICAL FIELD OF THE INVENTION

The present invention relates generally to an input circuit for mode setting; and more specifically to an input circuit for mode setting that has excellent EMS (Electromagnetic Susceptibility) resistance. The input circuit is applicable to a sound generating LSI, communication LSI, and so on, that is controllable by a microcomputer.

BACKGROUND OF THE INVENTION

Recently, integration technologies of semiconductor devices are remarkably developed, enabling to design multi-functional microcomputer chips without difficulties. As an example of them, there is realized a bi-functional microcomputer chip equipped with additional patterns for in-circuit emulation, in order to economize times and costs for program developing, wherein the additional patterns are to be inactivated when the microcomputer chip is served for its original use. For the purpose, there is provided a bonding pat on the microcomputer chip of this kind, connected to an input circuit for selecting an operation mode of the microcomputer and to be bonded in a manufacturing process to a ground GND or a power supply VDD for determining the operation mode according to actual use.

As it is impractical to prepare bonding pads for the ground GND and the power supply VDD right and left of the bonding pad for mode setting, the input circuit is generally designed to control the operation mode corresponding to whether the concerning bonding pad is bonded to the ground GND, for example, or left open un-bonded.

However, when the bonding pad is merely left open, a through current flows from the power supply VDD to the ground GND through an nMOS transistor and a pMOS transistor consisting in the input stage of the input circuit with their gates connected to the bonding pad left at high impedance, dissipating a power consumption. So, some countermeasures are devised for preventing the through current, by providing a pull-up resistor in the input stage, for example.

According to an invention described in the U.S. Pat. No. 5,764,075, logical status of a mode signal is latched in response to a RES signal and controls the status (on or off) of a pull-up resistor. However, the conventional circuit, according to the U.S. Pat. No. 5,764,075, EMS (Electromagnetic Susceptibility) resistance is not excellent enough. In other words, when an external noise is applied to the circuit, malfunction would occur.

OBJECTS OF THE INVENTION

Accordingly, it is an object of the present invention to provide an input circuit for mode setting having an excellent EMS (Electromagnetic Susceptibility) resistance.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the present invention, an input circuit for mode setting, comprising: a chip selection terminal that is accessed in a plurality of different operation modes; a mode setting terminal that is accessed to select an operation mode from the plurality of different operation modes; a logic holding circuit that holds a logic status of the mode setting terminal; and a control circuit that controls the logic holding circuit in accordance with a signal supplied to the chip selection terminal. Operation modes to be selected may be serial interface mode and parallel interface mode.

Preferably, the control circuit controls a connecting condition of the logic holding circuit at a timing that relatively short after resetting of the LSI.

The logic holding circuit may be a pull-up circuit, which pulls up a status of the mode setting terminal to a logic high, or a pull-down circuit, which pulls down a status of the mode setting terminal to a logic low.

Preferably, an input circuit further comprises a reset terminal, which is supplied with a first reset signal to rest the input circuit, wherein the control circuit also operates in accordance with the first reset signal.

The control circuit may comprise an inverter having an input terminal coupled to the mode setting terminal: and a data flip-flop circuit.

An input circuit may further comprise an interface circuit, which is coupled to the mode setting terminal. The mode setting terminal is coupled to the control circuit and the interface circuit via electrically different routes or paths.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
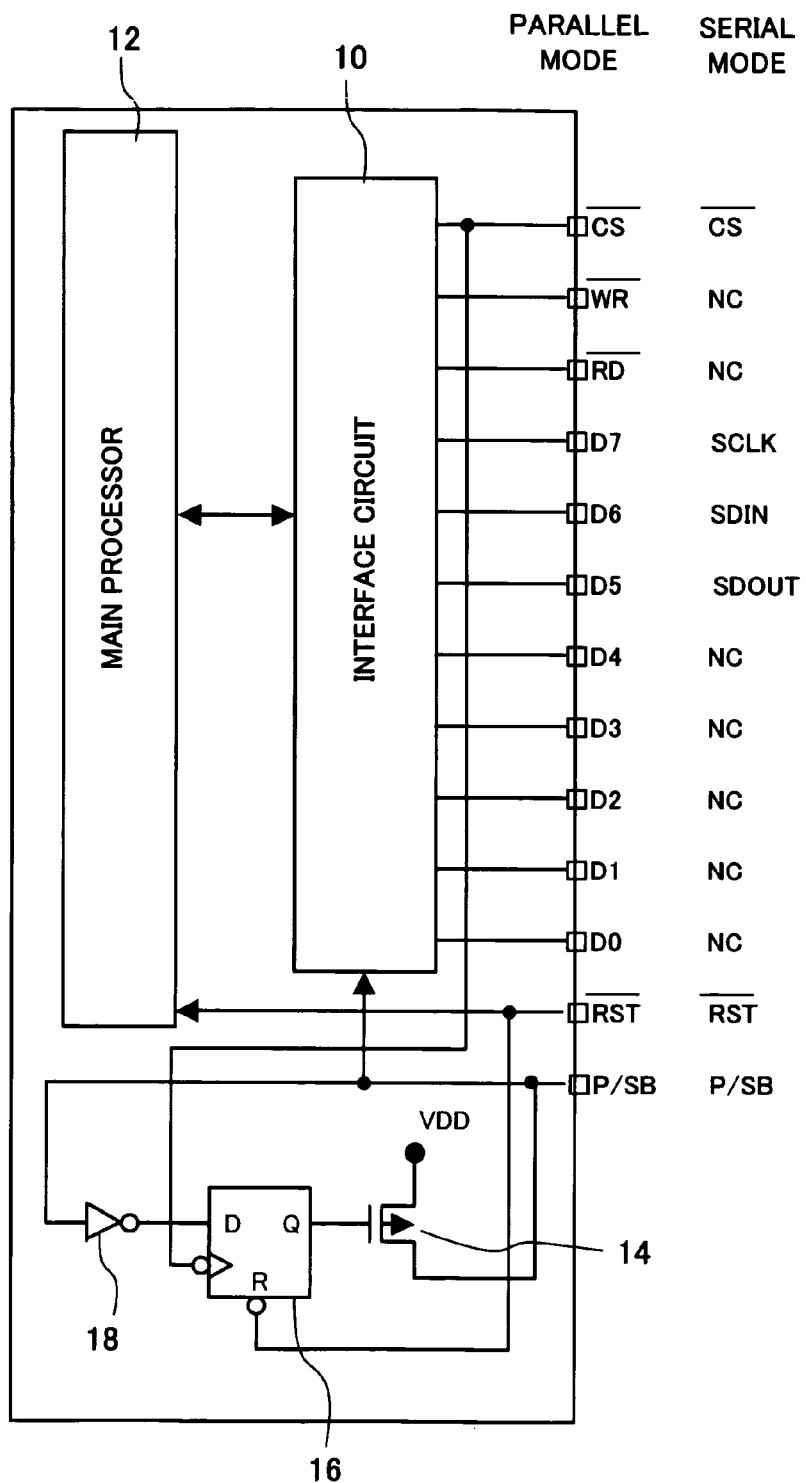
FIG. 1 is a circuit diagram showing an input circuit according to a first preferred embodiment of the present invention.

FIG. 1 is a circuit diagram showing an input circuit according to a first preferred embodiment of the present invention. An input circuit includes a chip selection terminal "CS" (CSB) that is operable both in first and second operation modes; a mode setting terminal "P/SB" that is used to select an operation mode from the first and second operation modes; a logic holding circuit 14 that holds a logic status at the mode setting terminal "P/SB"; and a control circuit (16 & 18) that controls the logic holding circuit 14 in accordance with a signal supplied to the chip selection terminal "CS".

The logic holding circuit 14 may be a pull-up resistor, which pulls up a status of the mode setting terminal "P/SB" to a logic high "H". The mode setting terminal "P/SB" may be supplied with a mode-selecting signal for one of serial interface and parallel interface. The control circuit includes a data flip-flop circuit 16 and an inverter 18. When the mode setting terminal P/SB is set at logic high "H", the input circuit is operating in a parallel interface mode. On the other hand, when the mode setting terminal P/SB is set at logic low "L", the input circuit is operating in a serial interface mode.

The input circuit further includes an interface circuit 10, a main processor 12 and a reset terminal RST. The interface circuit 10 is connected to terminals, which are to be used as terminals WR, RD and D0-D7 in a parallel interface mode and are to be used as terminals SCLK, SDIN and SDOUT in a serial interface mode. The chip selection terminal CS is used both in parallel and serial interface modes for selecting a chip to be controlled from an external device or circuit. In the serial interface mode, the remaining terminals may be used for other functions. The LSI is controlled in operation/standby in accordance with commands supplied to the above-described terminals. A power consumption of the LSI in a standby mode is almost zero.

The reset terminal RST is supplied with a reset signal, which is used to reset and initialize the input circuit. The data flip-flop circuit 16 operates in accordance with the reset signal RST and the chip selection signal CS. The pull-up resistor 14 is of a PMOS transistor; of which a source is connected to a power supply VDD.

An input terminal of the inverter 18 is connected to the mode setting terminal P/SB, and an output terminal thereof is connected to a data input terminal of the data flip-flop circuit 16. The mode setting terminal P/SB is also connected to the interface circuit 10 and a drain of the PMOS transistor 14. A gate of the PMOS transistor 14 is connected to an output terminal "Q" of the data flip-flop circuit 16. An input terminal of the data flip-flop circuit 16 is connected to the chip selection terminal CS. A reset terminal "R" of the data flip-flop circuit 16 is connected to the reset terminal RST, which is also connected to the main processor 12.

Figure 2:
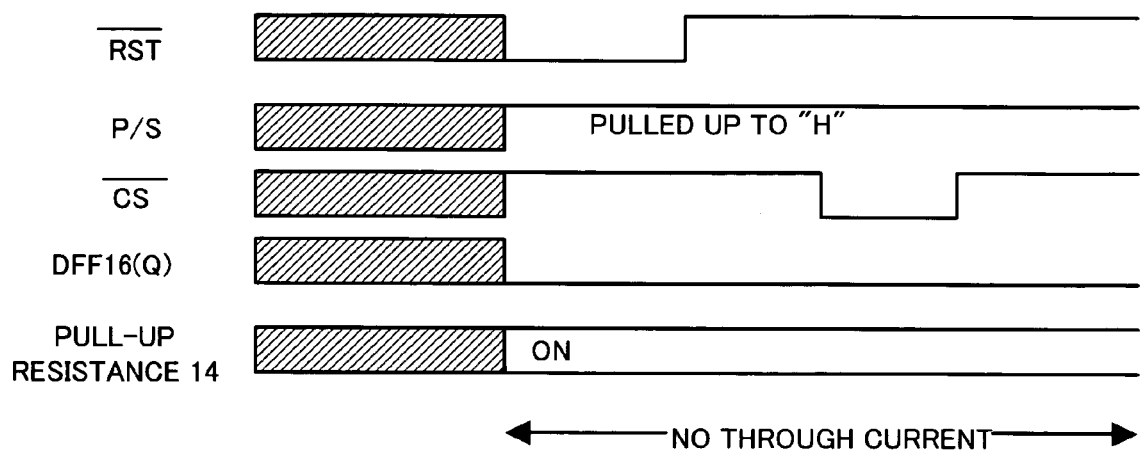
FIGS. 2-4 are timing charts showing operations of the input circuit according to the first preferred embodiment shown in FIG. 1.
Figure 3:
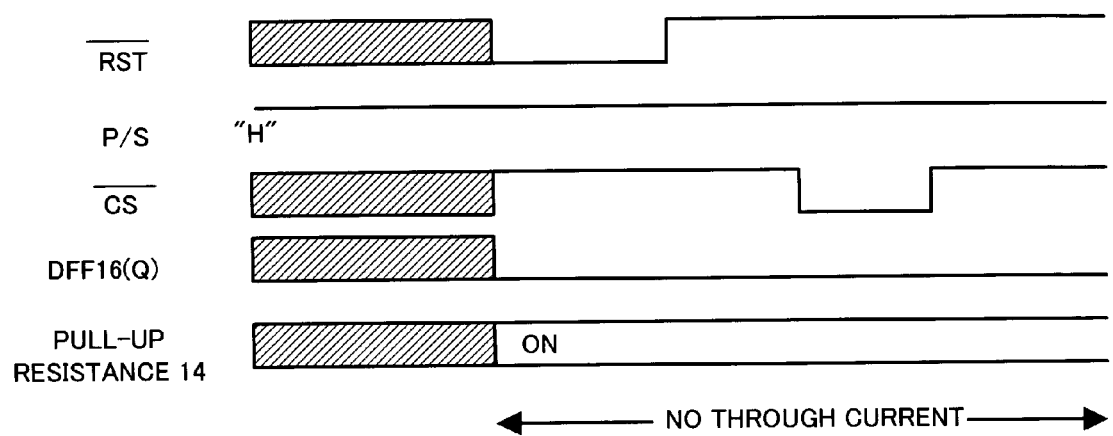
Figure 4:
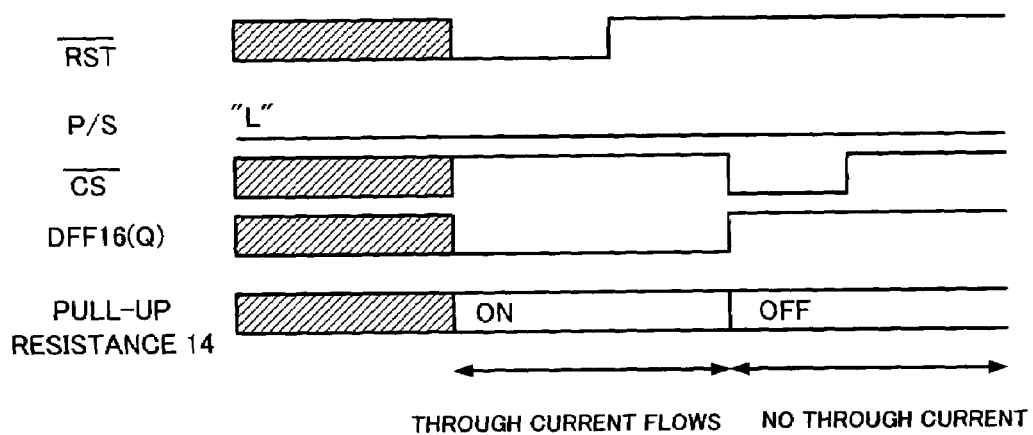

FIGS. 2-4 are timing charts showing operations of the input circuit according to the first preferred embodiment shown in FIG. 1. When a parallel interface mode is selected, the mode setting terminal P/SB is set at logic high "H" or Open, as shown in FIGS. 2 and 3. When a reset signal RST is supplied, the data flip-flop circuit 16 outputs a signal at logic low "L". The pull-up resistor 14 is at ON, and the mode setting terminal P/SB is pulled up to logic high "H" of VDD.

Next, when a signal at logic low "L" is supplied to the chip selection terminal CS for writing predetermined command (s), the data flip-flop circuit 16 is supplied with the current status of the mode setting terminal P/SB at a falling edge of the chip selection signal (CS). The data flip-flop circuit 16 is renewed or updated. At that time, the data flip-flop circuit 16 holds a data "L". The pull-up resistor 14 (PMOS transistor) is in a connected state, and the source and the drain thereof are at the same voltage level. As a result, no through current flows within the pull-up resistor 14.

In a parallel interface mode, the pull-up resistor 14 is maintained being connected, so that no through current would flow within the pull-up resistor 14, even if the mode setting terminal P/SB is at OPEN.

On the other hand, when a serial interface mode is selected, the mode setting terminal P/SB is set at logic high "L", as shown in FIG. 4. When a reset signal RST is supplied, the data flip-flop circuit 16 outputs a signal at logic low "L". The pull-up resistor 14 is at ON, and the mode setting terminal P/SB is pulled up to logic high "H" of VDD.

Next, when a signal at logic low "L" is supplied to the chip selection terminal CS for writing predetermined command (s), the data flip-flop circuit 16 is supplied with the current status of the mode setting terminal P/SB at a falling edge of the chip selection signal (CS). The data flip-flop circuit 16 is renewed or updated to logic high "H". The pull-up resistor 14 (PMOS transistor) is in OFF state, so that no through current would flow within the pull-up resistor 14, even if the mode setting terminal P/SB is fixed at logic low "L". As a result, low power consumption can be realized.

In a serial interface mode, the pull-up resistor 14 is disconnected after a first command is written. However, the pull-up resistor 14 is at OFF, so that no through current would flow within the pull-up resistor 14, even if a voltage (potential) difference is made between the source and drain thereof.

Now, operation of the input circuit when noises are applied to the terminals RST, P/SB and CSB is described. When a noise is entered to the reset terminal RST, a reset signal might be supplied to the data flip-flop circuit 16 and the output of the flip-flop circuit 16 might be reversed. The output terminal of the data flip-flop circuit 16 is only connected to the pull-up resistor 14. Therefore, if a noise is entered while the pull-up resistor 14 is off, the pull-up resistor 14 would be turned on. Conventionally, if the mode setting terminal P/SB is fixed at a low level "L" by external control, electric current would flow. However, according to the present invention, the pull-up resistor 14 is again disconnected in response to the next command, that is when a pulse signal is supplied to the chip selection terminal CSB, and the pull-up resistor 14 is returned to a condition in which no electric current flows therein.

Even if a noise is applied to the mode setting terminal P/SB, an output status of the data flip-flop circuit 16 would not be reversed. In other words, a connection status of the pull-up resistor 14 would not be changed.

The interface circuit 10 operates in accordance with a combination of logics at the terminals CSB, WRB and D0-D7 in a parallel interface mode. On the other hand, the interface circuit 10 operates in accordance with a combination of logics at the terminals CSB, SDIN and SCLK in a serial interface mode. Preferably, the logic at the mode setting terminal P/SB is latched using a control signal, such as CSB, so that the interface circuit 10 could be prevented from malfunction.

The chip selection terminal CSB (CS) is used as a clock terminal CLK. When a noise is applied to the chip selection terminal CSB, the logic at the mode setting terminal P/SB is latched again. A connection status of the pull-up resistor 14 would not be changed. Regarding affection to the interface circuit 10, even when a noise is applied to the chip selection terminal CSB, the interface circuit 10 would not recognize that noise signal as a command. Therefore, the interface circuit 10 could be prevented from malfunction.

Accordingly, the input circuit has an excellent EMS (Electromagnetic Susceptibility) resistance.

Figure 5:
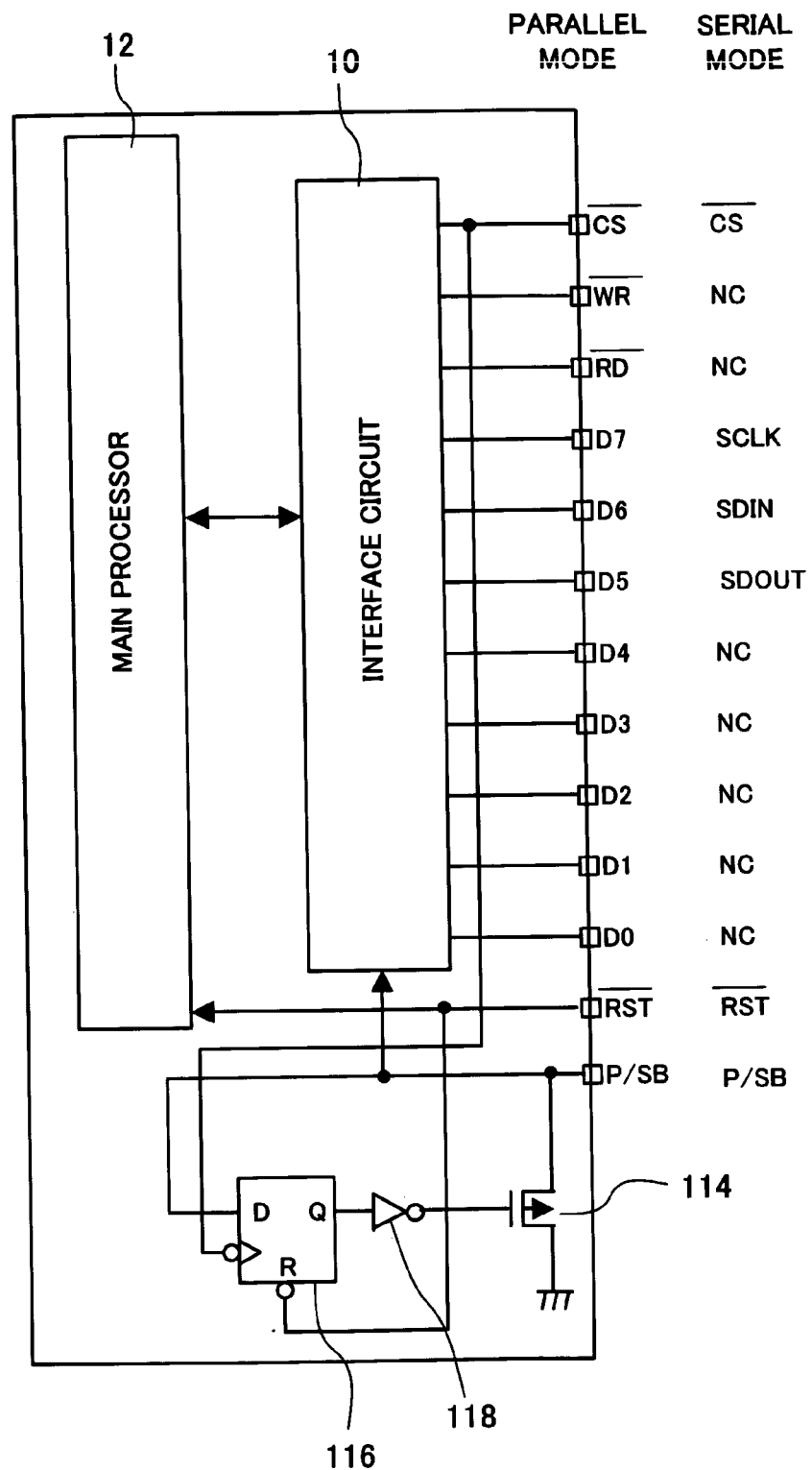
FIG. 5 is a circuit diagram showing an input circuit according to a second preferred embodiment of the present invention.

FIG. 5 is a circuit diagram showing an input circuit according to a second preferred embodiment of the present invention. In FIG. 5, the same and corresponding elements to those in FIG. 1 are represented by the same reference symbols, and the same description is basically not repeated. An input circuit according to the second preferred embodiment includes a chip selection terminal "CS" (CSB) that is operable both in first and second operation modes; a mode setting terminal "P/SB" that is used to select an operation mode from the first and second operation modes; a logic holding circuit 114 that holds a logic status at the mode setting terminal "P/SB"; and a control circuit (116 & 118) that controls the logic holding circuit 114 in accordance with a signal supplied to the chip selection terminal "CS".

The logic holding circuit 114 may be a pull-down resistor, which pulls down a status of the mode setting terminal "P/SB" to a logic high "L". The mode setting terminal "P/SB" may be supplied with a mode-selecting signal for one of serial interface and parallel interface. The control circuit includes a data flip-flop circuit 116 and an inverter 118. When the mode setting terminal P/SB is set at logic high "H", the input circuit is operating in a parallel interface mode. On the other hand, when the mode setting terminal P/SB is set at logic low "L", the input circuit is operating in a serial interface mode.

The input circuit further includes an interface circuit 10, a main processor 12 and a reset terminal RST. The interface circuit 10 is connected to terminals, which are to be used as terminals WR, RD and D0-D7 in a parallel interface mode and are to be used as terminals SCLK, SDIN and SDOUT in a serial interface mode. The chip selection terminal CS is used both in parallel and serial interface modes for selecting a chip to be controlled from an external device or circuit. In the serial interface mode, the remaining terminals may be used for other functions. The LSI is controlled in operation/standby in accordance with commands supplied to the above-described terminals. A power consumption of the LSI in a standby mode is almost zero.

The reset terminal RST is supplied with a reset signal, which is used to rest and initialize the input circuit. The data flip-flop circuit 116 operates in accordance with the reset signal RST and the chip selection signal CS. The pull-down resistor 114 is of a, NMOS transistor; of which a source is grounded.

A data input terminal of the data flip-flop circuit 116 is connected to the mode setting terminal P/SB, and an output terminal "Q" thereof is connected to an input terminal of the inverter 118. The mode setting terminal P/SB is also connected to the interface circuit 10 and a drain of the NMOS transistor 114. A gate of the NMOS transistor 114 is connected to an output terminal of the inverter 118. Another input terminal (clock terminal) of the data flip-flop circuit 116 is connected to the chip selection terminal CS. A reset terminal "R" of the data flip-flop circuit 116 is connected to the reset terminal RST, which Is also connected to the main processor 12.

Figure 6:
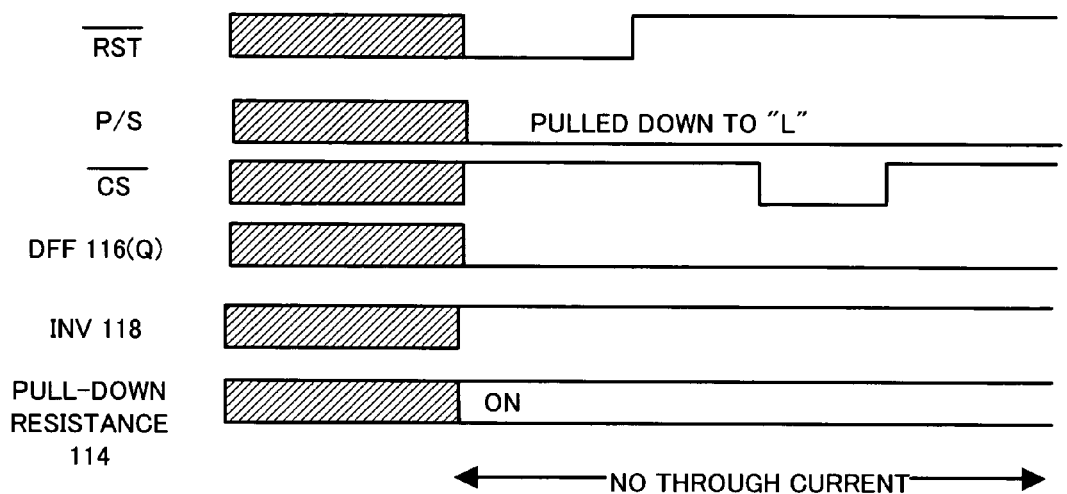
FIGS. 6-8 are timing charts showing operations of the input circuit according to the second preferred embodiment shown in FIG. 5.
Figure 7:
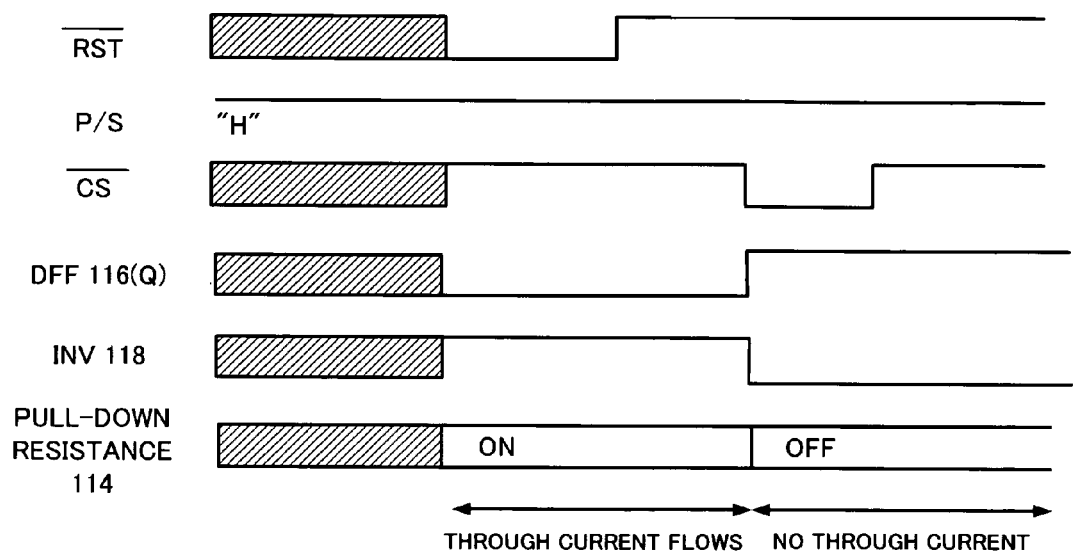
Figure 8:
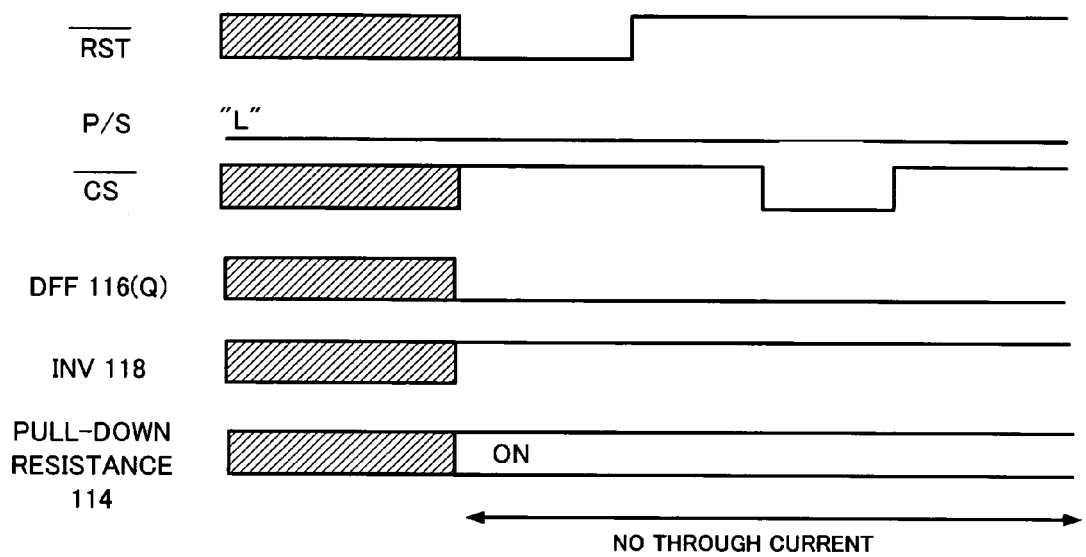

FIGS. 6-8 are timing charts showing operations of the input circuit according to the second preferred embodiment shown in FIG. 5. When a parallel interface mode is selected, the mode setting terminal P/SB is set at logic high "H", as shown in FIG. 7. When a reset signal RST is supplied, the data flip-flop circuit 116 outputs a signal at logic low "L". The inverter 118 outputs a signal at logic high "H". The pull-down resistor 114 is at ON, and the mode setting terminal P/SB is pulled down to logic high "L".

Next, when a signal at logic low "L" is supplied to the chip selection terminal CS for writing predetermined command (s), the data flip-flop circuit 116 is supplied with the current status of the mode setting terminal P/SB at a falling edge of the chip selection signal (CS). An output (Q) of the data flip-flop circuit 116 is renewed to logic high "H", and an output of the inverter 118 is renewed to logic low "L". At that time, the pull-down resistor 114 (NMOS transistor) is in an off state. Even if the mode setting terminal P/SB is fixed at logic high "H", no through current would flow within the pull-down resistor 114.

On the other hand, when a serial interface mode is selected, the mode setting terminal P/SB is set at logic high "L" or open, as shown in FIGS. 6 and 8. When a reset signal RST is supplied, the data flip-flap circuit 116 outputs a signal at logic low "L". The inverter 118 outputs a signal at logic high "H". The pull-down resistor 114 is at ON, and the mode setting terminal P/SB is pulled down to logic low "L".

Next, when a signal at logic low "L" is supplied to the chip selection terminal CS for writing a predetermined command (s), the data flip-flop circuit 116 is supplied with the current status of the mode setting terminal P/SB at a falling edge of the chip selection signal (CS). An output (Q) of the data flip-flop circuit 116 is renewed but maintains at logic low "L". An output of the inverter 118 is held at logic high "H", and the pull-down resistor 114 (NMOS transistor) is kept in a connected condition. No voltage (potential) difference is made between the source and drain of the t pull-down resistor 114 (NMOS transistor), so that no through current would flow within the pull-down resistor 114.

In a serial interface mode, the pull-down resistor 118 is maintained being in a connected condition. Even if the mode setting terminal P/SB becomes an open condition, no through current would flow within the pull-down resistor 114.

In a parallel interface mode, the pull-down resistor 114 is disconnected after a first command is written. However, the pull-down resistor 114 is at OFF, so that no through current would flow within the pull-down resistor 114, even if a voltage (potential) difference is made between the source and drain thereof.

According to the second preferred embodiment, the same advantages as the first preferred embodiment can be obtained.

Figure 9:
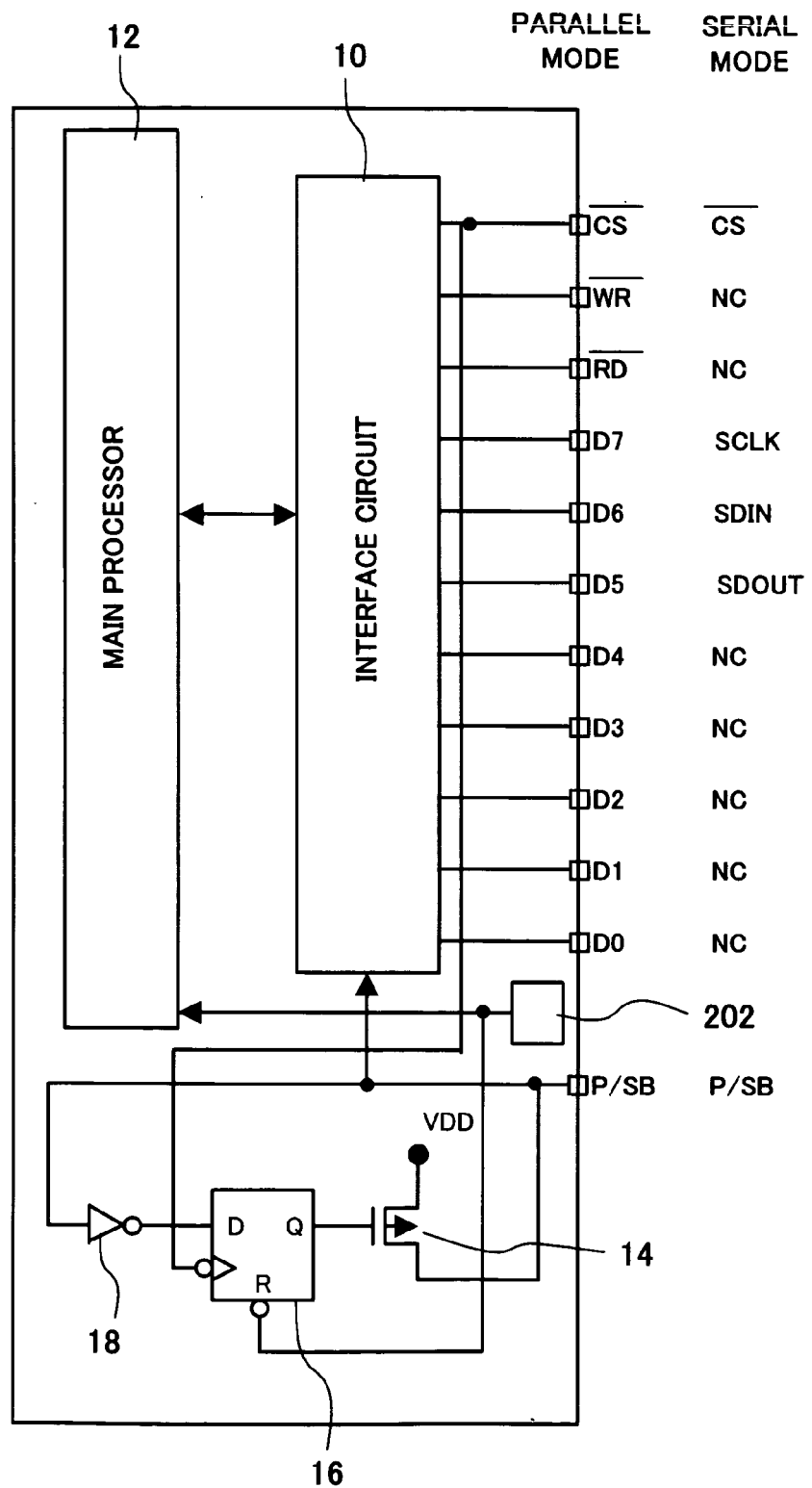
FIG. 9 is a circuit diagram showing an input circuit according to a third preferred embodiment of the present invention.

FIG. 9 is a circuit diagram showing an input circuit according to a third preferred embodiment of the present invention. In FIG. 9, the same and corresponding elements to those in FIGS. 1 and 5 are represented by the same reference symbols, and the same description is basically not repeated.

An input circuit includes a chip selection terminal "CS" (CSB) that is operable both in first and second operation modes; a mode setting terminal "P/SB" that is used to select an operation mode from the first and second operation modes; a logic holding circuit 14 that holds a logic status at the mode setting terminal "P/SB"; and a control circuit (16 & 18) that controls the logic holding circuit 14 in accordance with a signal supplied to the chip selection terminal "CS".

The logic holding circuit 14 may be a pull-up resistor, which pulls up a status of the mode setting terminal "P/SB" to a logic high "H". The mode setting terminal "P/SB" may be supplied with a mode-selecting signal for one of serial interface and parallel interface. The control circuit includes a data flip-flop circuit 16 and an inverter 18. When the mode setting terminal P/SB is set at logic high "H", the input circuit is operating in a parallel interface mode. On the other hand, when the mode setting terminal P/SB is set at logic low "L", the input circuit is operating in a serial interface mode.

The input circuit further includes an interface circuit 10, a main processor 12 and a power-on reset circuit 202. The interface circuit 10 is connected to terminals, which are to be used as terminals WR, RD and D0-D7 in a parallel interface mode and are to be used as terminals SCLK, SDIN and SDOUT in a serial interface mode. The chip selection terminal CS is used both in parallel and serial interface modes for selecting a chip to be controlled from an external device or circuit. In the serial interface mode, the remaining terminals may be used for other functions. The LSI is controlled in operation/standby in accordance with commands supplied to the above-described terminals. A power consumption of the LSI in a standby mode is almost zero.

The power-on reset circuit 202 supplies a reset signal in response to a power-on action of the LSI for resetting and initialize the input circuit. The data flip-flop circuit 16 operates in accordance with the reset signal and the chip selection signal CS. The pull-up resistor 14 is of a PMOS transistor; of which a source is connected to a power supply VDD.

An input terminal of the inverter 18 is connected to the mode setting terminal P/SB, and an output terminal thereof is connected to a data input terminal of the data flip-flop circuit 16. The mode setting terminal P/SB is also connected to the interface circuit 10 and a drain of the PMOS transistor 14. A gate of the PMOS transistor 14 is connected to an output terminal "Q" of the data flip-flop circuit 16. An input terminal of the data flip-flop circuit 16 is connected to the chip selection terminal CS. A reset terminal "R" of the data flip-flop circuit 16 is connected to an output terminal of the power-on reset circuit 202, which is also connected to the main processor 12.

Figure 10:
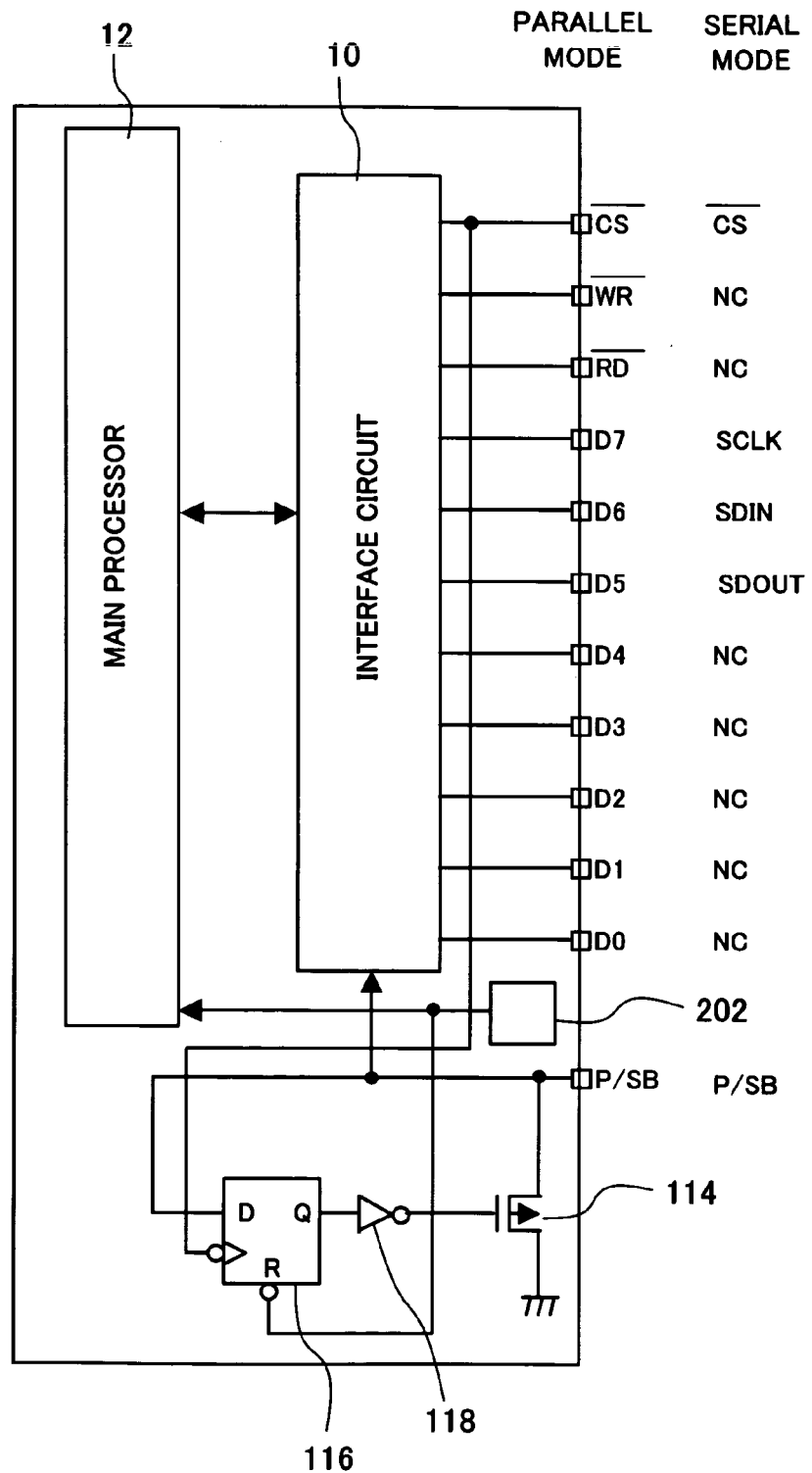
FIG. 10 is a circuit diagram showing an input circuit according to a fourth preferred embodiment of the present invention.

FIG. 10 is a circuit diagram showing an input circuit according to a fourth preferred embodiment of the present invention. In FIG. 10, the same and corresponding elements to those in FIGS. 1, 5 and 9 are represented by the same reference symbols, and the same description is basically not repeated.

An input circuit according to the second preferred embodiment includes a chip selection terminal "CS" (CSB) that is operable both in first and second operation modes; a mode setting terminal "P/SB" that is used to select an operation mode from the first and second operation modes; a logic holding circuit 114 that holds a logic status at the mode setting terminal "P/SB"; and a control circuit (116 & 118) that controls the logic holding circuit 114 in accordance with a signal supplied to the chip selection terminal "CS".

The logic holding circuit 114 may be a pull-down resistor, which pulls down a status of the mode setting terminal "P/SB" to a logic high "L". The mode setting terminal "P/SB" may be supplied with a mode-selecting signal for one of serial interface and parallel interface. The control circuit includes a data flip-flop circuit 116 and an inverter 118. When the mode setting terminal P/SB is set at logic high "H", the input circuit is operating in a parallel interface mode. On the other hand, when the mode setting terminal P/SB is set at logic low "L", the input circuit is operating in a serial interface mode.

The input circuit further includes an interface circuit 10, a main processor 12 and a power-on reset circuit 202. The interface circuit 10 is connected to terminals, which are to be used as terminals WR, RD and D0-D7 in a parallel interface mode and are to be used as terminals SCLK, SDIN and SDOUT in a serial interface mode. The chip selection terminal CS is used both in parallel and serial interface modes for selecting a chip to be controlled from an external device or circuit. In the serial interface mode, the remaining terminals may be used for other functions. The LSI is controlled in operation/standby in accordance with commands supplied to the above-described terminals. A power consumption of the LSI in a standby mode is almost zero.

The power-on reset circuit 202 supplies a reset signal in response to a power-on action of the LSI for resetting and initialize the input circuit. The data flip-flop circuit 116 operates in accordance with the reset signal and the chip selection signal CS. The pull-down resistor 114 is of an NMOS transistor; of which a source is grounded.

A data input terminal of the data flip-flop circuit 116 is connected to the mode setting terminal P/SB, and an output terminal "Q" thereof is connected to an input terminal of the inverter 118. The mode setting terminal P/SB is also connected to the interface circuit 10 and a drain of the NMOS transistor 114. A gate of the NMOS transistor 114 is connected to an output terminal of the inverter 118. Another input terminal (clock terminal) of the data flip-flop circuit 116 is connected to the chip selection terminal CS. A reset terminal "R" of the data flip-flop circuit 116 is connected to an output terminal of the power-on reset circuit 202, which is also connected to the main processor 12.

Figure 11:
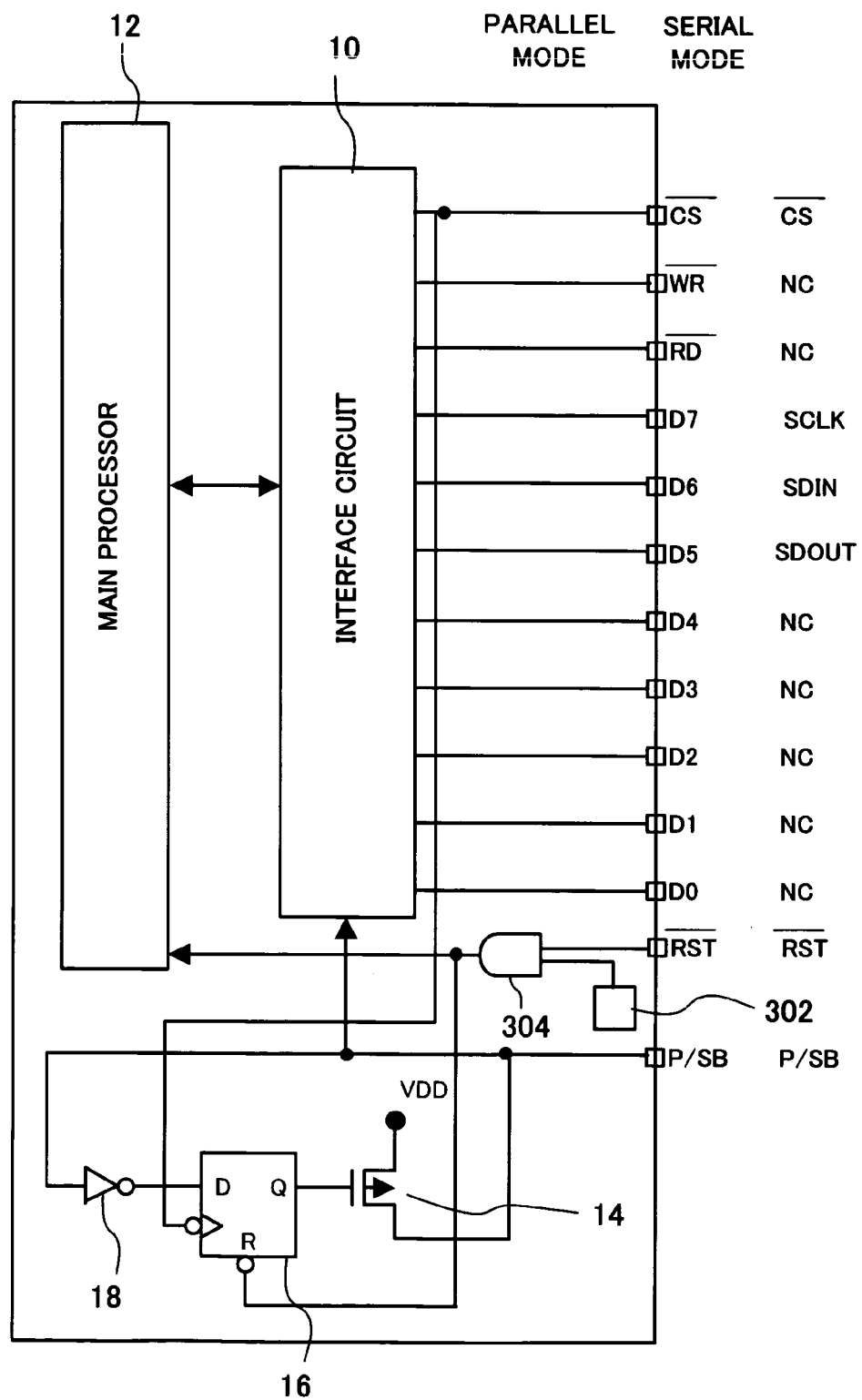
FIG. 11 is a circuit diagram showing an input circuit according to a fifth preferred embodiment of the present invention.

FIG. 11 is a circuit diagram showing an input circuit according to a fifth preferred embodiment of the present invention. In FIG. 11, the same and corresponding elements to those in FIGS. 1, 5, 9 and 10 are represented by the same reference symbols, and the same description is basically not repeated.

An input circuit includes a chip selection terminal "CS" (CSB) that is operable both in first and second operation modes; a mode setting terminal "P/SB" that is used to select an operation mode from the first and second operation modes; a logic holding circuit 14 that holds a logic status at the mode setting terminal "P/SB"; and a control circuit (16 & 18) that controls the logic holding circuit 14 in accordance with a signal supplied to the chip selection terminal "CS".

The logic holding circuit 14 may be a pull-up resistor, which pulls up a status of the mode setting terminal "P/SB" to a logic high "H". The mode setting terminal "P/SB" may be supplied with a mode-selecting signal for one of serial interface and parallel interface. The control circuit includes a data flip-flop circuit 16 and an inverter 18. When the mode setting terminal P/SB is set at logic high "H", the input circuit is operating in a parallel interface mode. On the other hand, when the mode setting terminal P/SB is set at logic low "L", the input circuit is operating in a serial interface mode.

The input circuit further includes an interface circuit 10, a main processor 12, a reset terminal "RST", a power-on reset circuit 202 and an AND circuit 304. The interface circuit 10 is connected to terminals, which are to be used as terminals WR, RD and D0-D7 in a parallel interface mode and are to be used as terminals SCLK, SDIN and SDOUT in a serial interface mode. The chip selection terminal CS is used both in parallel and serial interface modes for selecting a chip to be controlled from an external device or circuit. In the serial interface mode, the remaining terminals may be used for other functions. The LSI is controlled in operation/standby in accordance with commands supplied to the above-described terminals. A power consumption of the LSI in a standby mode is almost zero.

The reset terminal "RST" supplies a first reset signal, while the power-on reset circuit 202 supplies a second reset signal in response to a power-on action of the LSI. An output terminal of the power-on reset circuit 302 and the reset terminal RST are connected to input terminals of the AND circuit 304. An output terminal of the AND circuit 304 is connected to a reset terminal of the data flip-flop circuit 16 and the main processor 12.

The data flip-flop circuit 16 operates in accordance with an output signal of the AND circuit 304 and the chip selection signal CS. The pull-up resistor 14 is of a PMOS transistor; of which a source is connected to a power supply VDD.

An input terminal of the inverter 18 is connected to the mode setting terminal P/SB, and an output terminal thereof is connected to a data input terminal of the data flip-flop circuit 16. The mode setting terminal P/SB is also connected to the interface circuit 10 and a drain of the PMOS transistor 14. A gate of the PMOS transistor 14 is connected to an output terminal "Q" of the data flip-flop circuit 16. An input terminal of the data flip-flop circuit 16 is connected to the chip selection terminal CS.

Figure 12:
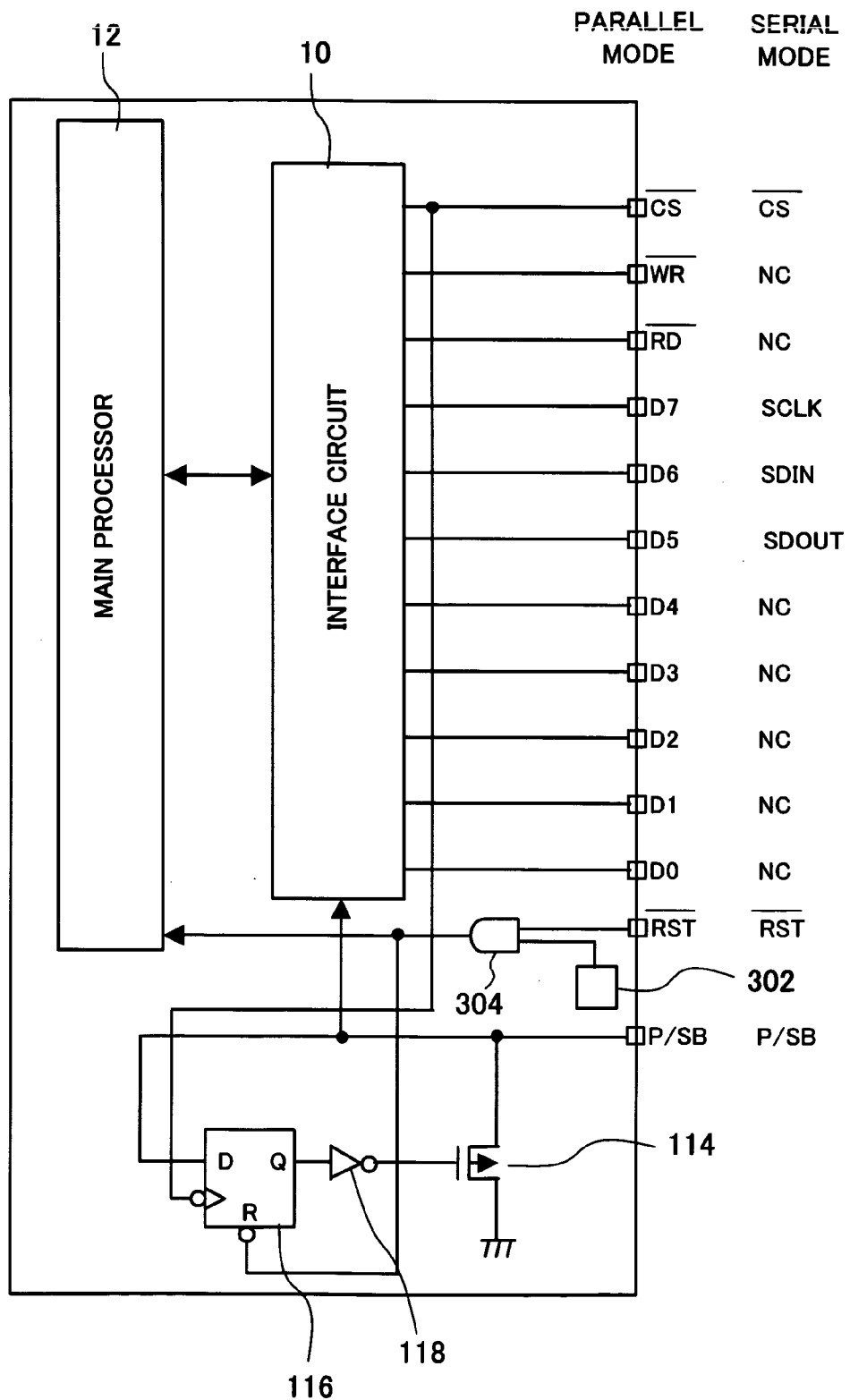
FIG. 12 is a circuit diagram showing an input circuit according to a sixth preferred embodiment of the present invention.

FIG. 12 is a circuit diagram showing an input circuit according to a sixth preferred embodiment of the present invention. In FIG. 12, the same and corresponding elements to those in FIGS. 1, 5, 9, 10 and 11 are represented by the same reference symbols, and the same description is basically not repeated.

An input circuit according to the second preferred embodiment includes a chip selection terminal "CS" (CSB) that is operable both in first and second operation modes; a mode setting terminal "P/SB" that is used to select an operation mode from the first and second operation modes; a logic holding circuit 114 that holds a logic status at the mode setting terminal "P/SB"; and a control circuit (116 & 118) that controls the logic holding circuit 114 in accordance with a signal supplied to the chip selection terminal "CS".

The logic holding circuit 114 may be a pull-down resistor, which pulls down a status of the mode setting terminal "P/SB" to a logic high "L". The mode setting terminal "P/SB" may be supplied with a mode-selecting signal for one of serial interface and parallel interface. The control circuit includes a data flip-flop circuit 116 and an inverter 118. When the mode setting terminal P/SB is set at logic high "H", the input circuit is operating in a parallel interface mode. On the other hand, when the mode setting terminal P/SB is set at logic low "L", the input circuit is operating in a serial interface mode.

The input circuit further includes an interface circuit 10, a main processor 12, a reset terminal "RST", a power-on reset circuit 202 and an AND circuit 304. The interface circuit 10 is connected to terminals, which are to be used as terminals WR, RD and D0-D7 in a parallel interface mode and are to be used as terminals SCLK, SDIN and SDOUT in a serial interface mode. The chip selection terminal CS is used both in parallel and serial interface modes for selecting a chip to be controlled from an external device or circuit. In the serial interface mode, the remaining terminals may be used for other functions. The LSI is controlled in operation/standby in accordance with commands supplied to the above-described terminals. A power consumption of the LSI in a standby mode is almost zero.

The reset terminal "RST" supplies a first reset signal, while the power-on reset circuit 202 supplies a second reset signal in response to a power-on action of the LSI. An output terminal of the power-on reset circuit 302 and the reset terminal RST are connected to input terminals of the AND circuit 304. An output terminal of the AND circuit 304 is connected to a reset terminal of the data flip-flop circuit 16 and the main processor 12.

The data flip-flop circuit 116 operates in accordance with an output signal of the AND circuit 304 and the chip selection signal CS. The pull-down resistor 114 is of an NMOS transistor; of which a source is grounded.

A data input terminal of the data flip-flop circuit 116 is connected to the mode setting terminal P/SB, and an output terminal "Q" thereof is connected to an input terminal of the inverter 118. The mode setting terminal P/SB is also connected to the interface circuit 10 and a drain of the NMOS transistor 114. A gate of the NMOS transistor 114 is connected to an output terminal of the inverter 118. Another input terminal (clock terminal) of the data flip-flop circuit 116 is connected to the chip selection terminal CS.

What is claimed is:

1. An input circuit for mode setting, comprising:
   a chip selection terminal that is accessed in a plurality of different operation modes;
   a mode setting terminal that is accessed to select an operation mode from the plurality of different operation modes, said mode setting terminal being formed as a pad and connected to an interface circuit;
   a logic holding circuit that holds a logic status of the mode setting terminal; and
   a control circuit that controls the logic holding circuit in accordance with a signal supplied to the chip selection terminal,
   wherein the logic holding circuit receives a signal from the control circuit, and the logic holding circuit includes an output terminal directly connected to the mode setting terminal.

2. An input circuit for mode setting according to claim 1, wherein
   the logic holding circuit is a pull-up circuit, which holds a status of the mode setting terminal at a logic high.

3. An input circuit for mode setting according to claim 2, further comprising:
   a reset terminal, which is supplied with a first reset signal to reset the input circuit, wherein
   the control circuit also operates in accordance with the first reset signal.

4. An input circuit for mode setting according to claim 3, wherein
   the control circuit comprises:
   an inverter having an input terminal coupled to the mode setting terminal: and
   a data flip-flop circuit, which has input terminals coupled to the reset terminal, the chip selection terminal and an output terminal of the inverter; and an output terminal coupled to the logic holding circuit.

5. An input circuit for mode setting according to claim 2, wherein the pull-up circuit is a PMOS transistor, a drain of which is connected to the mode setting terminal.

6. An input circuit for mode setting according to claim 1, wherein
   the logic holding circuit is a pull-down circuit, which holds a status of the mode setting terminal at a logic low.

7. An input circuit for mode setting according to claim 6, further comprising:
   a reset terminal, which is supplied with a first reset signal to reset the input circuit, wherein
   the control circuit also operates in accordance with the first reset signal.

8. An input circuit for mode setting according to claim 7, wherein
   the control circuit comprises:
   an inverter having an output terminal coupled to the logic holding circuit: and
   a data flip-flop circuit, which has input terminals coupled to the reset terminal, the chip selection terminal and the mode setting terminal of the input circuit;
   and an output terminal coupled to an input terminal of the inverter.

9. An input circuit for mode setting according to claim 6, wherein the pull-down circuit is a NMOS transistor, a drain of which is connected to the mode setting terminal.

10. An input circuit for mode setting according to claim 1, further comprising:
    a reset terminal, which is supplied with a first reset signal to reset the input circuit, wherein the control circuit also operates in accordance with the first reset signal.

11. An input circuit for mode setting according to claim 1, further comprising:
   a power-on reset circuit, which generates a reset signal in response to a power-on operation to reset the input circuit, wherein
   the control circuit also operates in accordance with the reset signal.

12. An input circuit for mode setting according to claim 1, wherein
   the mode setting terminal is supplied with a mode selecting signal for one of serial interface and parallel interface.

13. An input circuit for mode setting according to claim 1, further comprising:
   an interface circuit, which is coupled to the mode setting terminal, wherein
   the mode setting terminal is coupled to the control circuit and the interface circuit via electrically different routes.

14. An input circuit for mode setting, comprising;
   a chip selection terminal that is accessed in a plurality of different operation modes;
   a mode setting terminal that is accessed to select an operation mode from the plurality of different operation modes, said mode setting terminal being formed as a pad and connected to an interface circuit;
   a logic holding circuit that holds a logic status of the mode setting terminal:
   a control circuit that controls the logic holding circuit in accordance with a signal supplied to the chip selection terminal;
   a reset terminal, which is supplied with a first reset signal to reset the input circuit;
   a power-on reset circuit, which generates a second reset signal in response to a power-on operation to reset the input circuit; and
   an AND circuit, comprising input terminals to which the first and second reset signals are supplied and an output terminal coupled to a reset terminal of the control circuit;
   wherein the logic holding circuit receives a signal from the control circuit, and the logic holding circuit includes an output terminal connected to the mode setting terminal.

* * * * *